United States Patent
Liu et al.

(10) Patent No.: US 6,780,943 B2
(45) Date of Patent: Aug. 24, 2004

(54) COMPOSITION OF BARBITURIC ACID-MODIFIED BMI AND PPE CHAIN-BROKEN IN PHENOL RESIN

(75) Inventors: Shur-Fen Liu, Hsinchu (TW); Meng-Huei Chen, Kaohsiung Hsien (TW); Jinn-Shing King, Hsinchu Hsien (TW); Jing-Pin Pan, Hsinchu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 69 days.

(21) Appl. No.: 10/162,400

(22) Filed: Jun. 5, 2002

(65) Prior Publication Data

US 2003/0144430 A1 Jul. 31, 2003

(30) Foreign Application Priority Data

Dec. 12, 2001 (TW) .................................... 90130790 A

(51) Int. Cl.$^7$ .......................... C08K 3/36; C08L 63/02; C08L 63/10; C08L 71/12
(52) U.S. Cl. ...................... 525/502; 523/457; 524/594; 525/486
(58) Field of Search .................... 523/457; 524/594; 525/486, 502

(56) References Cited

U.S. PATENT DOCUMENTS 5,326,794 A * 7/1994 Pan et al. .................... 523/454
5,880,221 A * 3/1999 Liska et al. .................. 525/397
6,589,656 B2 * 7/2003 Maekawa et al. ........... 428/418

FOREIGN PATENT DOCUMENTS

| JP | 48055994 A | * 8/1973 | ............ B29D/3/02 |
| JP | 58056825 A | * 4/1983 | ............ B29D/7/02 |
| JP | 09328601 A | * 12/1997 | ............ C08L/61/14 |
| JP | 10265553 A | * 10/1998 | ............ C08G/59/62 |
| JP | 11302529 A | * 11/1999 | ......... C08F/283/08 |

* cited by examiner

Primary Examiner—Robert Sellers
(74) Attorney, Agent, or Firm—Birch, Stewart, Kolasch & Birch, LLP

(57) ABSTRACT

A resin composition useful in the fabrication of circuit boards comprises (i) 1~15 W % of bismaleimide modified by barbituric acid (BTA) and its derivatives; and (ii) 20~50 wt % of polyphenylene ether (PPE) chain-broken in a phenol resin; wherein the phenol resin is terpene phenol resin or dicyclopentadiene phenol resin. Other additives, such as curing agent, catalyst or inorganic particle additive can be added as well, based on requirements. According to the invention, terpene novolac resin and initiator (peroxide) are added in polyphenylene ether so that molecules are rearranged to form a PPE resin having lower molecular weight and higher crosslinking density. Furthermore, BMI/epoxy resin/PPE are combined in different weight percentages. Semi-interpenetrating polymer network structures are thus formed. Consequently, $T_g$ and resistances both to heat and solvent of the resin are increased.

9 Claims, No Drawings

COMPOSITION OF BARBITURIC ACID-MODIFIED BMI AND PPE CHAIN-BROKEN IN PHENOL RESIN

BACKGROUND OF THE INVENTION

1. Field of the Invention

The present invention relates to a resin composition, in particular, a resin composition for circuit boards.

2. Description of the Prior Art

In order to meet the current trend in electronic products, i.e. smaller, thinner, ands lighter, printed circuit boards must be highly-densified to obtain higher transmission speeds, and maintain integrity of signals. This need is achieved by lowering dielectric constant (DK) and dissipation factor (Df) of printed circuit boards to improve signal transmission speed, at the same time reducing the loss of signal transmission. In the past, the major substrate material was thermoset epoxy resin, but DK, Df and moisture absorption of epoxy resin are high, which causes signal delay in high frequency transmission. This aspect associated with signal transmission speed and quality is particularly significant for future information communication products with high frequency and high speed. Therefore, a substrate material with low Df, low DK, good heat resistance and high glass transition temperature (Tg) is a key point in the related research and development.

Polyphenylene ether (PPE), often used as a substrate material, is considered to exhibit excellent electrical properties and good resistance both to acid and alkali. Hence, it is by nature a good electronic material. However, being thermoplastic in nature, PPE is not stable at high temperatures, and it is easily soluble in halide and aromatic solvents. These shortcomings must be overcome to obtain a good substrate material for PCBs, which has good resistance to heat and solvents with the original advantages of PPE unaffected. Earliest modification method is to introduce other thermosetting resin to compensate these shortcomings. However, unfavored problems, such as bad compatibility and difficulties in further processing due to differences in chemical structures and polarity are easily induced. Failing to maintain original advantages of PPE is also one of the reasons that this method cannot be accepted. For example, U.S. Pat. No. 6,051,662 discloses that adding epoxy resin to PPE improves its resistance to heat and solvents and adhesion. But $T_g$ is not high enough (162~170° C.), which might affect the reliability of products when used as high density interconnecting (HDI) substrates or integrated circuit (IC) carriers. As a result, improving the resistance to heat and $T_g$ of low DK material has become one of the most important aspects for developing high frequency substrates.

SUMMARY OF THE INVENTION

In order to overcome the above problems, an object of the invention is to provide a novel resin composition for circuit boards prepared by mixing modified BMI, epoxy resin and PPE to form a varnish with good compatibility. Glass fiber cloths are then dipped in the resin composition to make prepregs, followed by lamination of the prepregs with copper foil at high temperatures to form copper foil substrates. In other words, various combinations of BMI/epoxy resin/PPE are prepared to form semi-interpenetrating polymer network (IPN) structures. Consequently, a resin composition having high $T_g$, lower DK, low Df and good resistance to heat and solvents is obtained for applications as printed circuit board substrates or IC carriers.

PPE used in this invention is different from that disclosed in U.S. Pat. No. 5,880,221, i.e. PPE is modified by terpene phenol novolac resin or dicyclopentadiene phenol resin to lower its molecular weight, and to further increase the crosslinking density thereby improving $T_g$ and heat resistance.

In order to achieve the above objects, there is provided a resin composition for circuit boards, comprising: (i) 1~15 wt % of bismaleimide modified by barbituric acid (BTA) or its derivatives; and (ii) 20~50 wt % of polyphenylene ether (PPE) chain-broken with a phenol resin; wherein the phenol resin is terpene phenol resin or dicyclopentadiene phenol resin.

Amine curing agents, imidazole catalysts and inorganic particle additives can be added to the resin composition of the invention, depending on various conditions. Preferable inorganic particle additives are aluminum hydroxide, barium sulfide, sodium carbonate, silica and silicate. The goal of additives is to increase dimensional stability, thus expanding the scope of applications of the resin composition. Since the additives are able to increase dimensional stability, the coefficient of thermal expansion (CTE) is effectively lowered.

Component (i) of the resin composition can be mixed directly with epoxy resin and PPE, or it can be mixed with novolac resin, alcohol acid resin, polyester, polyimide, polyurethane, cyanate esters, vinyl and benzocyclobutene resin.

According to the invention, PPE is reacted with suitable amounts of chain-breaking agents such as terpene novolac resin or cyclopentadiene phenol resin, and a stuitable amount of initiator (peroxide). During the reaction, molecules are rearranged to form a PPE resin with lower molecular weight of 3500~8000 and higher crosslinking density. As a result, resistances both to heat and solvent are increased.

The steps involved to prepare the resin composition of the invention are as follows:

a. adding a suitable amount of epoxy resin and solvent in a BMI/BTA mixture at 100~130° C. for 0.5~6 hrs, where the molar ratio of BMI/BTA is 3:1~20:1;

b. preparing PPE: adding a suitable amount of phenol resin, initiator (peroxide) and solvent to PPE (molecular weight 40000) and maintaining the number average molecular weight at 3500~8000;

c. adding a suitable amount of epoxy resin and curing agent to the solution obtained in step (a);

d. combining a suitable amount of PPE obtained in step (b) and the mixture obtained in step (c), followed by adding catalyst and additive at room temperature to obtain a varnish; where the solid content is between 65 and 45%, and the amount of modified BMI is 1~15 wt % of the total solid content; and e. dipping a glass fiber cloth in the varnish obtained in step (d) to form a prepreg, followed by laminating the prepreg with a copper foil to obtain a copper foil substrate with lower DK and high $T_g$.

Detailed description of various components of the resin composition of the invention is as follows:

(1) Bismaleimide (BMI), having the formula of:

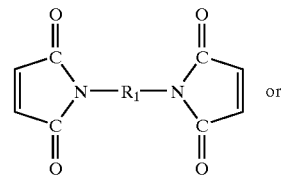 or

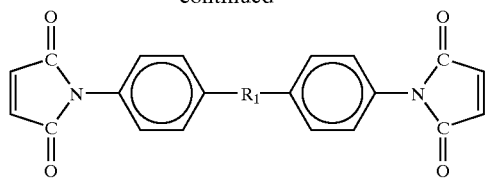

Wherein $R_1$ is aryl, aliphatic, cycloaliphatic or aliphatic group containing silane; examples are: N,N'ethylene-bis-maleimide, N,N'-butylene-bis-maleimide, N,N'-hexamethylene-bis-maleimide, N,N'-phenylene-bis-maleimide, N,N'-4,4-diphenyl methane-bis-maleimide, N,N'-4,4-diphenyl ether-bis-maleimide, N,N'-4,4-diphenyl sulfone-bis-maleimide, N,N'-4,4-dicyclohexylmethane-bis-maleimide, N,N'-4,4-xylene-bis-maleimide, N,N'-4,4-diphenyl cyclohexane-bis-maleimide;

(2) Barbituric acid (BTA):

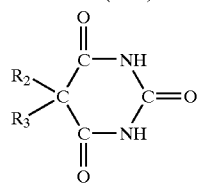

Wherein $R_2$, $R_3$ are —H, —CH$_3$, —C$_2$H$_5$, —C$_6$H$_5$, —CH(CH$_3$)$_2$, —CH$_2$CH(CH$_3$)$_2$, —CH$_2$CH$_2$CH(CH$_3$)$_2$, or

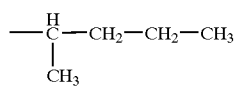

(3) Epoxy Resin
  Diglycidyl ether of bisphenol A epoxy, tetrabromo bisphenol-A diglycidyl ether epoxy, cyclo aliphatic epoxy resin, dicyclopentadiene epoxy resin, naphthalene epoxy resin, biphenyl epoxy resin, phenol novolac epoxy resin, o-cresol novalac epoxy resin;

(4) Polyphenylene ether (PPE), having the repeating unit of the formula of:

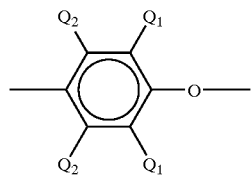

Wherein $Q_1$ is independently hydrogen, primary or secondary lower alkyl, phenyl, haloalkyl, aminoalkyl, hydroxycarbonoxy or halohydrocarbonoxy; and $Q_2$ is hydrogen, halogen, primary or secondary lower alkyl, phenyl, haloalkyl, hydroxycarbonoxy or halohydrocarbonoxy;

(5) Phenol resin:
Terpene-di-resorcinol

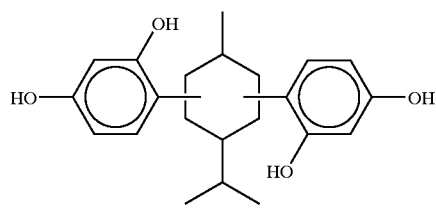

Terpene-di-Catechol

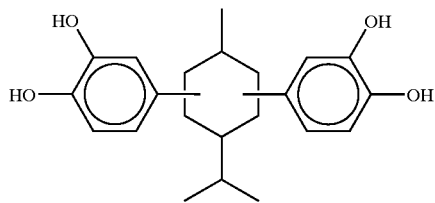

Terpene phenol resin(for example MP402) having the repeating unit of the formula of:

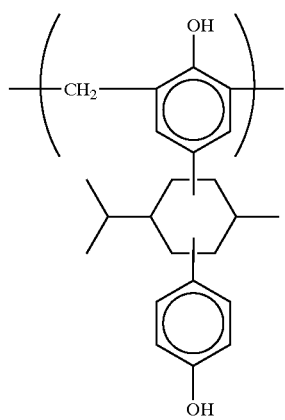

Dicyclopentadiene phenol resin having the repeating unit of the formula of:

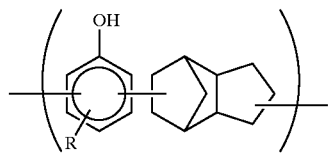

Wherein R is H or CH$_3$;
4, 4', 4''-(ethylidene) trisphenol

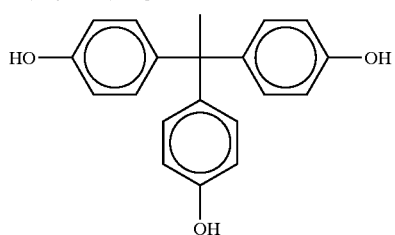

Tetraphenylolethane

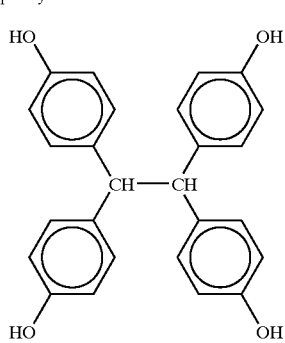

Tetracresololethane

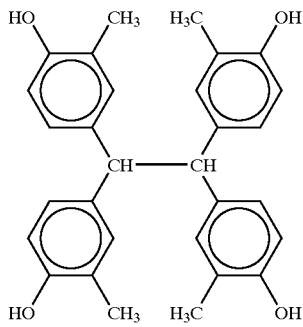

Tetraxylenolethane

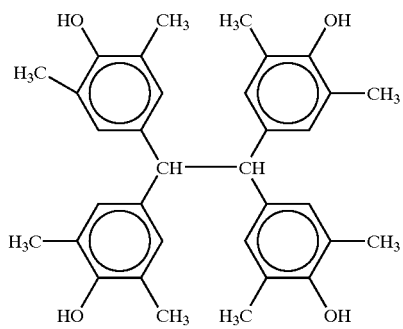

(6) Initiator:
Peroxide, such as:
Benzoyl peroxide (BPO)

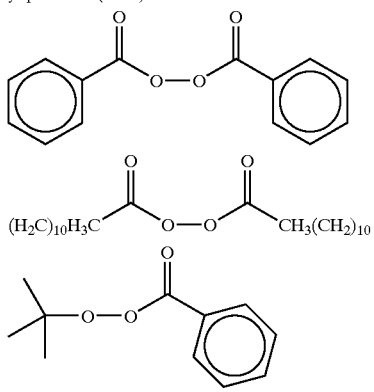

Quinone derivatives:

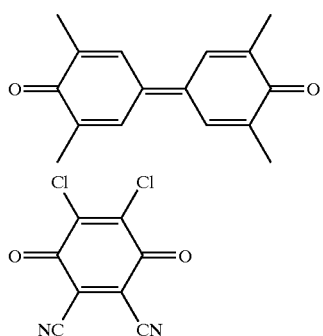

(7) Curing Agent
Diamine, $H_2N-R_4-NH_4$, where $R_4$ is aryl, aliphatic, cycloaliphatic, aliphatic group containing silane, such as:

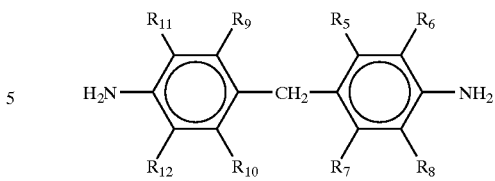

Where $R_5$ to $R_{12}$ are H, $CH_3$, $C_2H_5$, $C_3H_7$, $C(CH_3)_2$ etc, (and wherein $R_5$ to $R_{12}$ cannot be hydrogen at the same time)

(8) Catalyst (Imidazole)
1-methylimidazole
1,2-dimethylimidazole
2-methylimidazole
2-heptadecylimidazole
2-undecylimidazole
2-ethyl-4-methylimidazole According to the resin composition provided in the invention, BMI/epoxy resin/PPE are combined in different weight percentages, semi-interpenetrating polymer network (IPN) structures are thus formed. Therefore, a resin composition having satisfactory properties, such as high $T_g$, lower DK, low Df and good resistances both to heat and solvents is obtained. The resin composition provided not only can be used as substrate material such as dipped glass fiber cloths, but also applicable as other substrates, for instance, high frequency transmission printed circuit boards, IC substrate, such as ball grid array (BGA), chip scale/size packages (CSP), and flip chip.

The present invention will become more fully understood from the detailed description of preferred embodiments given hereinbelow, given by way of illustration only and thus not intended to be limitative of the present invention.

DETAILED DESCRIPTION OF THE PREFERRED EMBODIMENTS

Preferred Embodiments

Resin compositions for circuit boards with various compositions shown in Table 1 are prepared. The process follows: placing a suitable amount of bisphenol-A bisepoxy propyl ether (epoxy 1), tetrabromobisphenol A bisepoxy propyl ether (epoxy 2), cycloaliphatic epoxy (epoxy 3) in a reactor, followed by adding bismaleimide (BMI) and barbituric acid (BTA) dissolved in γ-butyrolacetone (BGL) to form a mixture. The mixture was then heated to 130° C. to react for 1~4 hours. After the reaction was completed, the mixture was cooled to 70° C., followed by adding a suitable amount of DMF to adjust the sold content to 60~80%, thereby forming a fully compatible solution. Finally a suitable amount of curing agent (diamine) was added into the solution to form solution A.

PPE was heated and dissolved in toluene, followed by adding suitable amounts of Terpene phenol novolac resin (T1), dicyclopentadienephenol resin (DCPD) and bisphenol A (BPA) and benzoyl peroxide (BPO) to form a mixture. The mixture was reacted in 95~85° C. for 1~3 hours to form solution B.

Finally, solution A and solution B were mixed together, followed by adding a suitable amount of catalyst to form a compatible solution.

The above procedures were repeated to prepare various compositions listed in Table 1. Glass fiber cloth were then dipped in various solutions, followed by heating to remove solvents so that they were partially cured to form prepregs. Those prepregs were then laminated and cured with copper foil at high temperatures (about 190° C., 3 hours) to form copper foil substrates. Physical properties of the substrates were tested and listed in Table 2.

resin ($T_1$) is used, $T_g$ is 176° C., higher than $T_g$ (165° C.) obtained in the $2^{nd}$ Comparative Embodiment using bisphenol-A (BPA). Furthermore, heat resistance and size

TABLE 1

| Composition (g) | $1^{st}$ Embodiment | $2^{nd}$ Embodiment | $3^{rd}$ Embodiment | $1^{st}$ comparative Embodiment | $2^{nd}$ comparative Embodiment | $3^{rd}$ comparative Embodiment |
|---|---|---|---|---|---|---|
| BMI | 11.1 | 26 | 11.1 | 0 | 0 | 11.1 |
| BTA | 0.64 | 1.67 | 0.64 | 0 | 0 | 0 |
| Epoxy 1 | 33.1 | 30.1 | 33.1 | 36.9 | 23.8 | 33.0 |
| Epoxy 2 | 77.1 | 76 | 77.1 | 78 | 49.8 | 77.0 |
| Epoxy 3 | 90.1 | 86 | 90.1 | 92.7 | 60.1 | 90.1 |
| PPE | 120.8 | 115.3 | 120.8 | 124.6 | 80.2 | 1208 |
| PPE Mn | 5390 | 5510 | 5080 | 5760 | 5320 | 5420 |
| DCPD | 0 | 0 | 6.04 | 0 | 0 | 0 |
| $T_1$ | 6.04 | 5.76 | 0 | 6.3 | 0 | 6.04 |
| BPA | 0 | 0 | 0 | 0 | 4.01 | 0 |
| BPO | 6.04 | 5.76 | 6.04 | 6.23 | 4.01 | 6.04 |
| Diamine | 24.10 | 23.05 | 24.10 | 24.91 | 16.4 | 24.10 |
| Imidazole | 0.83 | 0.83 | 0.93 | 0.83 | 0.62 | 0.83 |

Note:
Diamine: 4,4'-Diamino-3,3'-diethyl-5,5'-dimethyl diphenylmethane

TABLE 2

| Properties | $1^{st}$ Embodiment | $2^{nd}$ Embodiment | $3^{rd}$ Embodiment | $1^{st}$ comparative Embodiment | $2^{nd}$ comparative Embodiment | $3^{rd}$ comparative Embodiment |
|---|---|---|---|---|---|---|
| $T_g$ (° C.) | 192 | 200 | 196 | 176 | 165 | 170.195 |
| Soldering Resistance (288° C., 3 min after PCT 1 hr) | Good | Good | Good | Good | Poor | Poor |
| Z-axis expansion | 3.4 | 3.5 | 3.3 | 4.3 | 4.7 | — |
| Dielectric constant (1 MHz) | 3.83 | 3.84 | 3.78 | 3.84 | 3.84 | 3.87 |
| Dissipation factor (1 MHz) | 0.0074 | 0.0076 | 0.0070 | 0.0073 | 0.0073 | 0.0075 |

Judging from Table 1 and Table 2, the $1^{st}$ Comparative Embodiment without the addition of BMI, $T_g$ is about 176° C., but in the cases where 3% and 7% of solid content of modified BMI were added in the $1^{st}$ Embodiment and the $2^{nd}$ Embodiment, $T_g$ are 192° C. and 200° C. respectively. This result shows that $T_g$ is greatly increased by adding BMI modified by BTA. In addition, good electrical properties and thermal stability are obtained in both $1^{st}$ Embodiment and $2^{nd}$ Embodiment.

In terms of compatibility, in the $3^{rd}$ Comparative Embodiment where unmodified BMI was used, the compatibility thereof with epoxy resin and PPE was not satisfactory, as obvious phase separation was observed. Also, resistance to heat was poor. Where BMI modified by BTA was used, such as $1^{st}$~$3^{rd}$ Embodiments, compatibility of BMI and epoxy resin and PPE was excellent, thus forming a desired single phase. Moreover, thermal stability and heat resistance were both satisfactory. It is also observed that when using DCPD instead of $T_1$ in the $3^{rd}$ Embodiment, electrical properties are improved.

Different phenol resins were used in the $1^{st}$ comparative embodiment and the $2^{nd}$ comparative embodiment to cause rearrangement reaction of the molecular weight of PPE. In the $1^{st}$ Comparative Embodiment, where terpene novolac stability of the $1^{st}$ Comparative Embodiment are better then that in the $2^{nd}$ Comparative Embodiment. If a small amount of modified BMI is added, such as $1^{st}$ Embodiment and $2^{nd}$ Embodiment, $T_g$ is raised even higher and a great improvement in heat resistance and lowering of CTE are achieved.

To sum up, modified BMI added to the resin compositions provided in the invention is able to improve $T_g$, heat and solvent resistance, thermal stability and other electrical properties, thus obtaining satisfactory substrate material for circuit boards. The resin compositions are also applicable in printed circuit boards (PCBs) and IC carriers.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A resin composition for circuit boards, comprising:

(i) From about 1 to 15 wt % of bismaleimide (BMI) modified by barbituric acid (BTA) and its derivatives;

(ii) from about 20 to 50 wt % of polyphenylene ether (PPE) chain-broken in a phenol resin;

(iii) a curing agent; and (iv) a catalyst;

wherein the phenol resin is terpene phenol resin or dicyclopentadiene phenol resin.

2. The resin composition as claimed in claim 1, wherein the molecular weight of component (ii) is 3500~8000.

3. The resin composition as claimed in claim 1, wherein the formula of BMI is as follows:

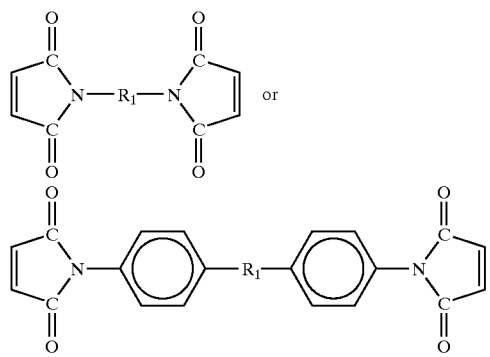

wherein $R_1$ is aryl, aliphatic, cycloaliphatic or aliphatic group containing silane.

4. The resin composition as claimed in claim 1, wherein the formulae of BTA and its derivatives are as follows:

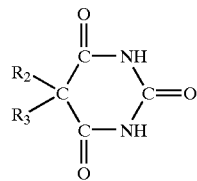

wherein $R_2$, $R_3$ are —H, —$CH_3$, —$C_2H_5$, —$C_6H_5$, —CH$(CH_3)_2$, —$CH_2CH(CH_3)_2$, or —$CH_2CH_2CH(CH_3)_2$, and

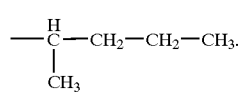

5. The resin composition as claimed in claim 1, wherein the formula of terpene phenol resin is:

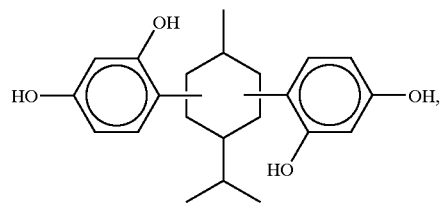

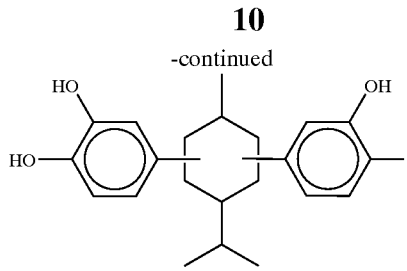

terpene phenol resin having the repeating unit of the formula of:

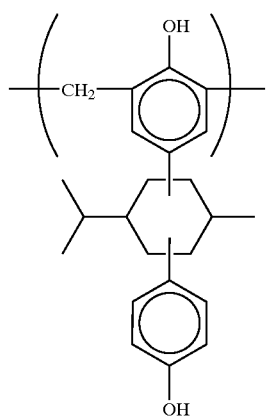

6. The resin composition as claimed in claim 1, wherein the formula of dicyclopentadiene phenol resin has the repeating unit of the formula of:

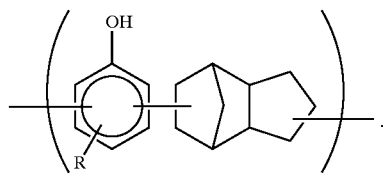

7. The resin composition as claimed in claim 1, wherein the formula of the curing agent is as follows:

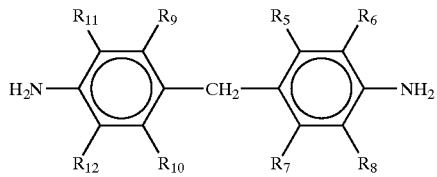

wherein $R_5$ to $R_{12}$ are H, $CH_3$, $C_2H_5$, $C_3H_7$, or $C(CH_3)_2$, (and wherein $R_5$ to $R_{12}$ cannot be hydrogen at the same time); or

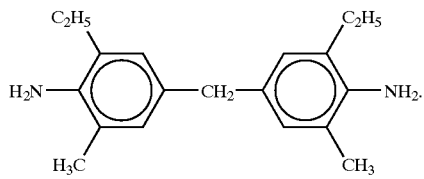

8. The resin composition as claimed in claim 1, further comprising an inorganic additive.

9. The resin composition as claimed in claim 8, wherein the inorganic additive is aluminum hydroxide, barium sulfide, sodium carbonate, silica and silicate.

* * * * *